US011995008B2

(12) United States Patent
Shen et al.

(10) Patent No.: US 11,995,008 B2
(45) Date of Patent: May 28, 2024

(54) MEMORY CONTROLLER WITH HYBRID DRAM/PERSISTENT MEMORY CHANNEL ARBITRATION

(71) Applicant: Advanced Micro Devices, Inc., Santa Clara, CA (US)

(72) Inventors: Guanhao Shen, Austin, TX (US); Ravindra Nath Bhargava, Austin, TX (US); James R. Magro, Lakeway, TX (US); Kedarnath Balakrishnan, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/354,806

(22) Filed: Jun. 22, 2021

(65) Prior Publication Data

US 2022/0405214 A1 Dec. 22, 2022

(51) Int. Cl.
*G06F 13/16* (2006.01)
*G11C 11/4063* (2006.01)

(52) U.S. Cl.
CPC ...... *G06F 13/1642* (2013.01); *G11C 11/4063* (2013.01)

(58) Field of Classification Search
CPC .................................................. G06F 13/1642
USPC ...................................................... 710/316
See application file for complete search history.

(56) References Cited

U.S. PATENT DOCUMENTS

| | | | | |
|---|---|---|---|---|
| 5,898,687 A | * | 4/1999 | Harriman | H04L 49/203 370/395.72 |
| 5,926,628 A | * | 7/1999 | Tran | G06F 13/364 710/116 |
| 6,092,158 A | * | 7/2000 | Harriman | G06F 13/1642 711/158 |
| 6,496,906 B1 | * | 12/2002 | Novak | G06F 13/1642 711/158 |
| 6,993,633 B1 | * | 1/2006 | Sakakibara | G06F 12/084 711/119 |

(Continued)

FOREIGN PATENT DOCUMENTS

| | | |
|---|---|---|
| JP | 2020016954 A | 1/2020 |
| KR | 20180118329 A | 10/2018 |

OTHER PUBLICATIONS

International Search Report and Written Opinion for International Application No. PCT/US2022/031102, dated Aug. 25, 2022, 7 pages.

*Primary Examiner* — Paul R. Myers
(74) *Attorney, Agent, or Firm* — Polansky & Associates, P.L.L.C.; Paul J. Polansky; Nathan H. Calvert (57) ABSTRACT

A memory controller includes a command queue having an input for receiving memory access commands for a memory channel, and a number of entries for holding a predetermined number of memory access commands, and an arbiter that selects memory commands from the command queue for dispatch to one of a persistent memory and a DRAM memory coupled to the memory channel. The arbiter includes a first-tier sub-arbiter circuit coupled to the command queue for selecting candidate commands from among DRAM commands and persistent memory commands, and a second-tier sub-arbiter circuit coupled to the first-tier sub-arbiter circuit for receiving the candidate commands and selecting at least one command from among the candidate commands.

20 Claims, 6 Drawing Sheets

(56) References Cited

U.S. PATENT DOCUMENTS

| | | | |
|---|---|---|---|
| 7,664,907 B1* | 2/2010 | Hutsell | G06F 13/1626 |
| | | | 711/E12.001 |
| 7,673,087 B1* | 3/2010 | Ansari | G06F 13/366 |
| | | | 710/309 |
| 8,271,746 B1* | 9/2012 | Hutsell | G06F 13/1642 |
| | | | 711/156 |
| 9,576,637 B1* | 2/2017 | Balakrishnan | G06F 3/0611 |
| 10,684,969 B2* | 6/2020 | Magro | G06F 13/1689 |
| 10,949,121 B2 | 3/2021 | Takano | |
| 11,321,230 B2 | 5/2022 | Oh et al. | |
| 2003/0005253 A1* | 1/2003 | Liao | G06F 13/1642 |
| | | | 711/167 |
| 2003/0188065 A1* | 10/2003 | Golla | H04L 47/623 |
| | | | 710/243 |
| 2004/0225847 A1 | 11/2004 | Wastlick et al. | |
| 2007/0198782 A1* | 8/2007 | Sved | G06F 13/1642 |
| | | | 711/154 |
| 2007/0294470 A1* | 12/2007 | Van Dyke | G06F 13/161 |
| | | | 711/104 |
| 2008/0273545 A1* | 11/2008 | Sgouros | H04L 47/6215 |
| | | | 370/412 |
| 2008/0288731 A1* | 11/2008 | Izumi | G06F 12/06 |
| | | | 711/E12.001 |
| 2009/0019243 A1* | 1/2009 | Hur | G06F 1/3287 |
| | | | 711/158 |
| 2010/0110748 A1* | 5/2010 | Best | G11C 7/22 |
| | | | 365/230.01 |
| 2011/0179200 A1* | 7/2011 | Sukonik | G06F 13/1626 |
| | | | 710/53 |
| 2013/0268735 A1* | 10/2013 | Gibert Codina | G06F 12/0815 |
| | | | 711/141 |
| 2014/0068203 A1* | 3/2014 | Son | G06F 3/068 |
| | | | 711/155 |
| 2014/0115254 A1* | 4/2014 | Sukonik | G06F 13/1636 |
| | | | 711/117 |
| 2014/0192801 A1* | 7/2014 | Machnicki | H04L 49/10 |
| | | | 370/355 |
| 2014/0379846 A1* | 12/2014 | Kanuri | G06F 12/0855 |
| | | | 709/216 |
| 2015/0049106 A1* | 2/2015 | Havlir | G06F 9/3885 |
| | | | 345/559 |
| 2018/0018133 A1 | 1/2018 | Balakrishnan | |
| 2020/0042469 A1 | 2/2020 | Fukami et al. | |
| 2020/0050366 A1* | 2/2020 | Bavishi | G06F 3/0656 |
| 2020/0050397 A1* | 2/2020 | Meyerowitz | G06F 13/1673 |

* cited by examiner

MEMORY CONTROLLER WITH HYBRID DRAM/PERSISTENT MEMORY CHANNEL ARBITRATION

BACKGROUND

Computer systems typically use inexpensive and high-density dynamic random access memory (DRAM) chips for main memory. Most DRAM chips sold today are compatible with various double data rate (DDR) DRAM standards promulgated by the Joint Electron Devices Engineering Council (JEDEC). DDR memory controllers are used to manage the interface between various memory accessing agents and DDR DRAMs according to published DDR standards.

A non-volatile dual-inline memory module with persistent storage ("NVDIMM-P") is a storage class memory that can be used in place of standard DDR DIMMs but includes persistent memory in addition to volatile memory for faster access to frequently requested data. However, these memories have non-deterministic access latencies and may have on-board media management activities that may temporarily delay the access to the non-volatile memory, and thus these memories require a handshake protocol to inform the host controller about the availability of data from the NVDIMM-P. JEDEC is developing a transactional protocol to mitigate the performance impact of this non-determinism, to provide capabilities to enable out-of-order transactions and to stack commands.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory controller includes a command queue having an input for receiving memory access commands for a memory channel, and a number of entries for holding a predetermined number of memory access commands. An arbiter selects memory commands from the command queue for dispatch to one of a persistent memory and a DRAM memory connected to the memory channel. The arbiter includes a first-tier sub-arbiter circuit connected to the command queue for selecting candidate commands from among DRAM commands and persistent memory commands, and a second-tier sub-arbiter circuit connected to the first-tier sub-arbiter circuit for receiving the candidate commands and selecting at least one command from among the candidate commands.

A method includes receiving a plurality of memory access requests including DRAM commands and persistent memory commands. The memory access commands are placed in a command queue to await dispatch to a DRAM memory and a persistent memory. Multiple candidate commands are selected from the command queue, in which at least two of the candidate commands are selected from among the DRAM commands and persistent memory commands. At least one command is selected from among the candidate commands for sending on the memory channel from the second tier.

A data processing system includes a memory channel connected to a DRAM memory and a persistent memory. A memory controller is connected to the memory channel and includes a command queue and an arbiter. The command queue has an input for receiving memory access commands for a memory channel, and a number of entries for holding a predetermined number of memory access commands. The arbiter selects memory commands from the command queue for transmission to one of the persistent memory and the DRAM memory. The arbiter includes a first-tier sub-arbiter circuit connected to the command queue for selecting candidate commands from among DRAM commands and persistent memory commands, and a second-tier sub-arbiter circuit connected to the first-tier sub-arbiter circuit for receiving the candidate commands and selecting at least one command from among the candidate commands.

Figure 1:
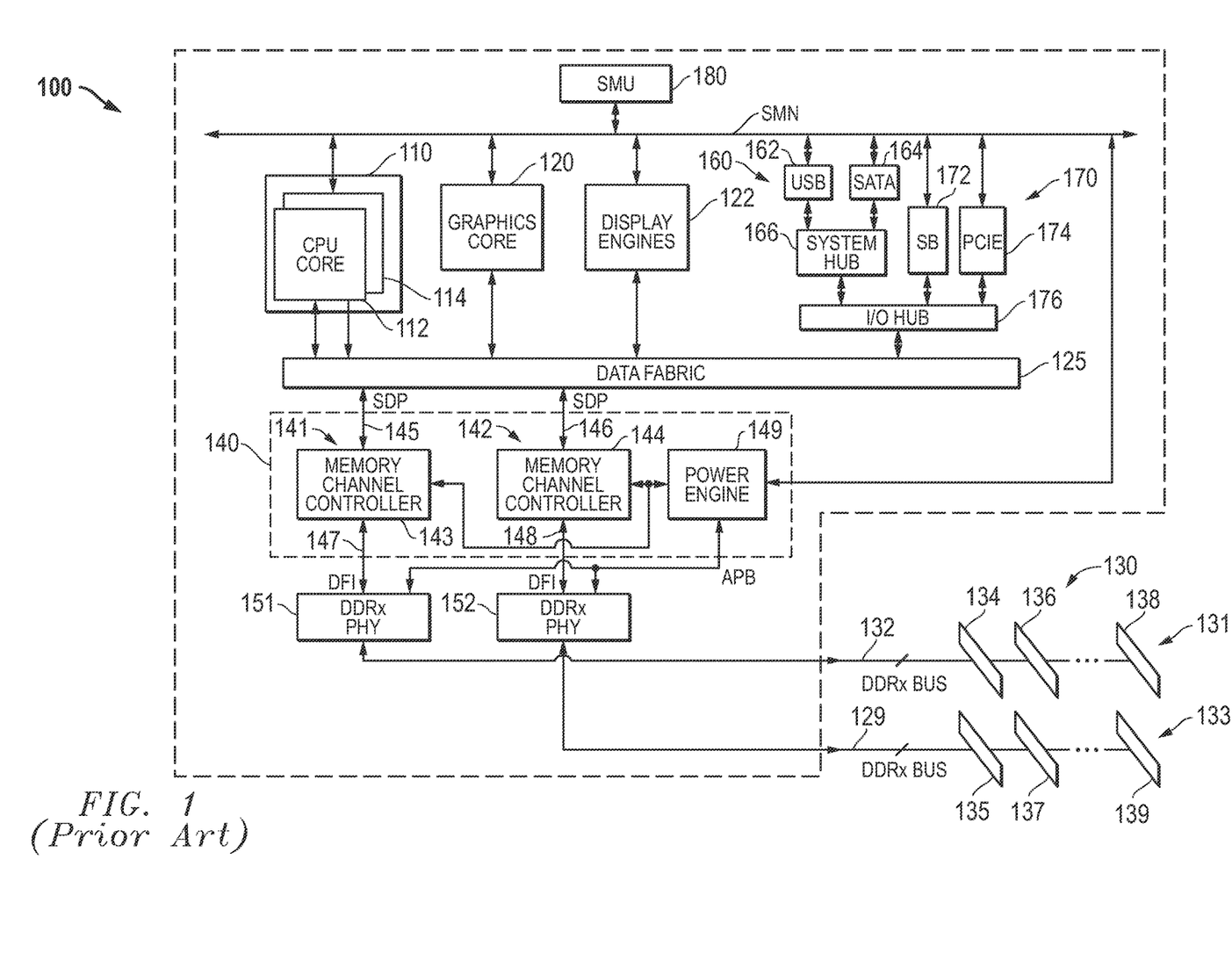
FIG. 1 illustrates in block diagram form an accelerated processing unit (APU) and memory system known in the prior art.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance graphics processing unit (GPU) capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a DDRx bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two double data rate (DDRx) memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
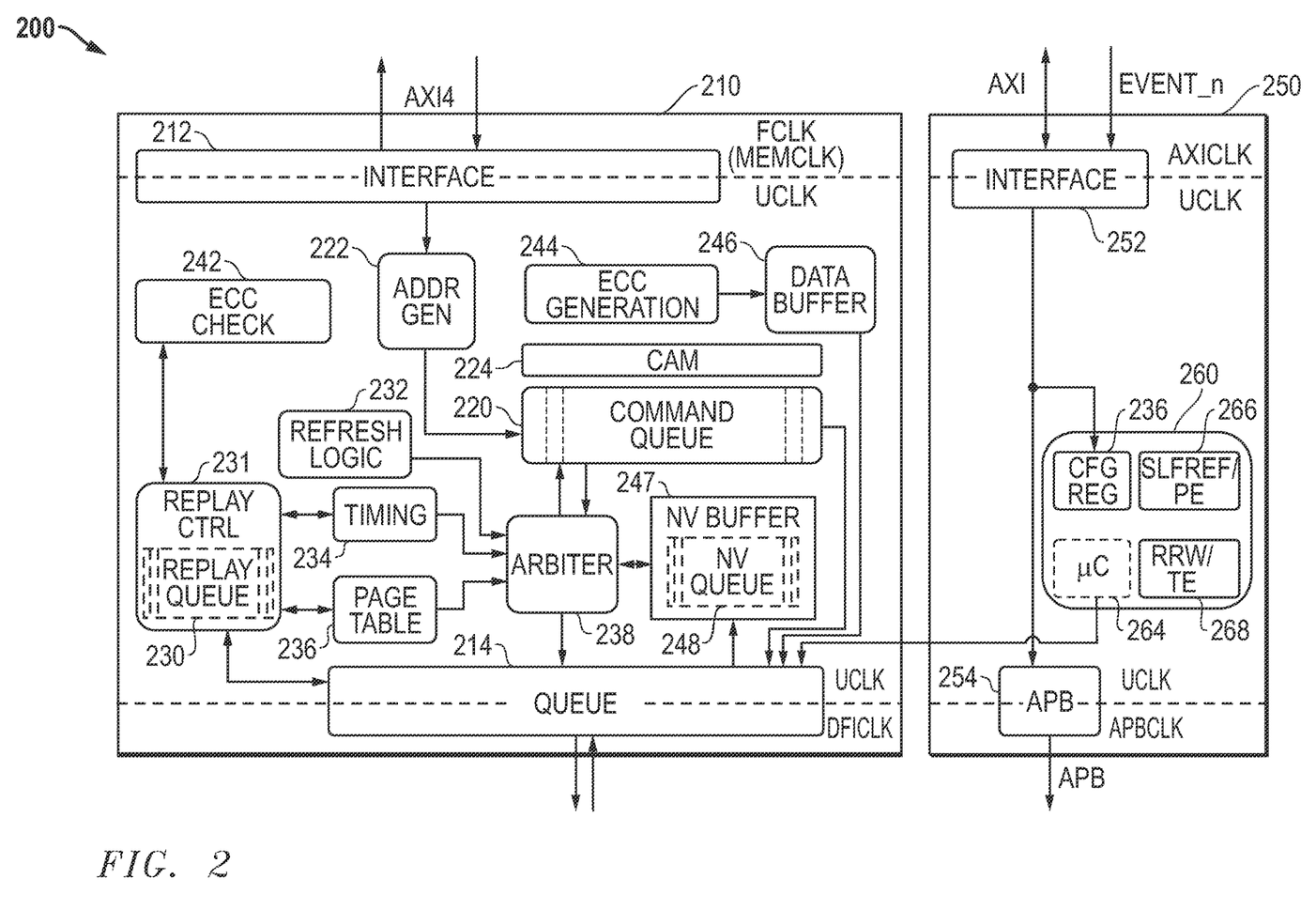
FIG. 2 illustrates in block diagram form a memory controller suitable for use in an APU like that of FIG. 1 according to some embodiments.

FIG. 2 illustrates in block diagram form a memory controller 200 that is suitable for use in an APU like that of FIG. 1. Memory controller 200 includes generally a memory channel controller 210 and a power controller 250. Memory channel controller 210 includes generally an interface 212, a memory interface queue 214, a command queue 220, an address generator 222, a content addressable memory (CAM) 224, replay control logic 231 including a replay queue 230, a refresh logic block 232, a timing block 234, a page table 236, an arbiter 238, an error correction code (ECC) check circuit 242, an ECC generation block 244, a data buffer 246, a non-volatile (NV) buffer 247, and a NV queue 248.

Interface 212 has a first bidirectional connection to data fabric 125 over an external bus, and has an output. In memory controller 200, this external bus is compatible with the advanced extensible interface version four specified by ARM Holdings, PLC of Cambridge, England, known as "AXI4", but can be other types of interfaces in other embodiments. Interface 212 translates memory access requests from a first clock domain known as the FCLK (or MEMCLK) domain to a second clock domain internal to memory controller 200 known as the UCLK domain. Similarly, memory interface queue 214 provides memory accesses from the UCLK domain to a DFICLK domain associated with the DFI interface.

Address generator 222 decodes addresses of memory access requests received from data fabric 125 over the AXI4 bus. The memory access requests include access addresses in the physical address space represented in a normalized format. Address generator 222 converts the normalized addresses into a format that can be used to address the actual memory devices in memory system 130, as well as to efficiently schedule related accesses. This format includes a region identifier that associates the memory access request with a particular rank, a row address, a column address, a bank address, and a bank group. On startup, the system BIOS queries the memory devices in memory system 130 to determine their size and configuration, and programs a set of configuration registers associated with address generator 222. Address generator 222 uses the configuration stored in the configuration registers to translate the normalized addresses into the appropriate format. Address generator 222 decodes the address range of the memory, including NVDIMM-P memory, and stores a decoded signal indicating whether the memory access request is a request to NVDIMM-P in command queue 220. Arbiter 238 can then prioritize the NVDIMM-P requests with appropriate priority relative to other requests. Command queue 220 is a queue of memory access requests received from the memory accessing agents in APU 100, such as CPU cores 112 and 114 and graphics core 120. Command queue 220 stores the address fields decoded by address generator 222 as well other address information that allows arbiter 238 to select memory accesses efficiently, including access type and quality of service (QoS) identifiers. CAM 224 includes information to enforce ordering rules, such as write after write (WAW) and read after write (RAW) ordering rules.

Error correction code (ECC) generation block 244 determines the ECC of write data to be sent to the NVDIMM-P. ECC check circuit 242 checks the received ECC against the incoming ECC.

Replay queue 230 is a temporary queue for storing selected memory accesses picked by arbiter 238 that are awaiting responses, such as address and command parity responses. Replay control logic 231 accesses ECC check circuit 242 to determine whether the returned ECC is correct or indicates an error. Replay control logic 231 initiates and controls a replay sequence in which accesses are replayed in the case of a parity or ECC error of one of these cycles. Replayed commands are placed in the memory interface queue 214.

Refresh logic 232 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 232 generates refresh commands periodically to prevent data errors caused by leaking of charge off storage capacitors of memory cells in DRAM chips. In addition, refresh logic 232 periodically calibrates ZQ to prevent mismatch in on-die termination resistance due to thermal changes in the system.

Arbiter 238 is bidirectionally connected to command queue 220 and is the heart of memory channel controller 210. It improves efficiency by intelligent scheduling of accesses to improve the usage of the memory bus. Arbiter 238 uses timing block 234 to enforce proper timing relationships by determining whether certain accesses in command queue 220 are eligible for issuance based on DRAM timing parameters. For example, each DRAM has a minimum specified time between activate commands, known as "$t_{RC}$". Timing block 234 maintains a set of counters that determine eligibility based on this and other timing parameters specified in the JEDEC specification, and is bidirectionally connected to replay queue 230. Page table 236 maintains state information about active pages in each bank and rank of the memory channel for arbiter 238, and is bidirectionally connected to replay queue 230.

NV buffer 247 stores NV read commands in NV queue 248, both for use in replay sequences, and for managing NV read responses. NV buffer 247 is bidirectionally connected to memory interface queue 214 for handling RD_RDY and SEND commands, and connected to arbiter 238 for providing a SEND command as an input when one or more SEND commands are available, as further described below.

In response to write memory access requests received from interface 212, ECC generation block 244 computes an ECC according to the write data. Data buffer 246 stores the write data and ECC for received memory access requests. It outputs the combined write data/ECC to memory interface queue 214 when arbiter 238 picks the corresponding write access for dispatch to the memory channel.

Power controller 250 generally includes an interface 252 to an advanced extensible interface, version one (AXI), an advanced peripheral bus (APB) interface 254, and a power engine 260. Interface 252 has a first bidirectional connection to the SMN, which includes an input for receiving an event signal labeled "EVENT_n" shown separately in FIG. 2, and an output. APB interface 254 has an input connected to the output of interface 252, and an output for connection to a PHY over an APB. Power engine 260 has an input connected to the output of interface 252, and an output connected to an input of memory interface queue 214. Power engine 260 includes a set of configuration registers 262, a microcontroller (µC) 264, a self refresh controller (SLFREF/PE) 266, and a reliable read/write timing engine (RRW/TE) 268. Configuration registers 262 are programmed over the AXI bus, and store configuration information to control the operation of various blocks in memory controller 200. Accordingly, configuration registers 262 have outputs connected to these blocks that are not shown in detail in FIG. 2. Self refresh controller 266 is an engine that allows the manual generation of refreshes in addition to the automatic generation of refreshes by refresh logic 232. Reliable read/write timing engine 268 provides a continuous memory access stream to memory or I/O devices for such purposes as DDR interface maximum read latency (MRL) training and loopback testing.

Memory channel controller 210 includes circuitry that allows it to pick memory accesses for dispatch to the associated memory channel. In order to make the desired arbitration decisions, address generator 222 decodes the address information into predecoded information including rank, row address, column address, bank address, and bank group in the memory system, and command queue 220 stores the predecoded information. Configuration registers 262 store configuration information to determine how address generator 222 decodes the received address information. Arbiter 238 uses the decoded address information, timing eligibility information indicated by timing block 234, and active page information indicated by page table 236 to efficiently schedule memory accesses while observing other criteria such as quality of service (QoS) requirements. For example, arbiter 238 implements a preference for accesses to open pages to avoid the overhead of precharge and activation commands required to change memory pages, and hides overhead accesses to one bank by interleaving them with read and write accesses to another bank. In particular during normal operation, arbiter 238 normally keeps pages open in different banks until they are required to be precharged prior to selecting a different page.

Figure 3:
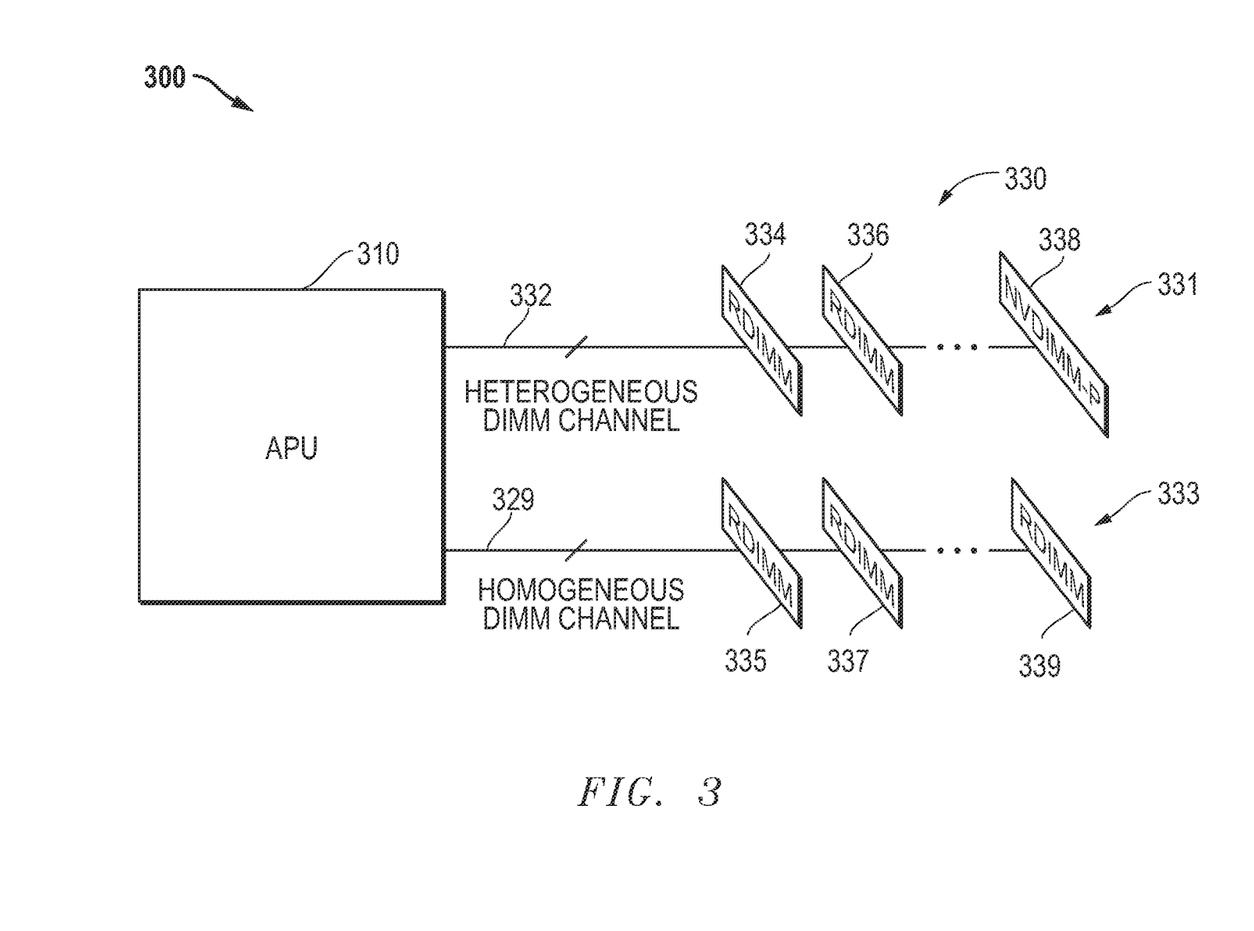
FIG. 3 illustrates in block diagram form a pair of memory channels and an APU according to some embodiments.

FIG. 3 illustrates in block diagram form a data processing system 300 according to some embodiments. Data processing system 300 includes a memory system 330 and an APU 310. APU 310 includes memory controllers like memory controller 200 (FIG. 2) supporting heterogenous memory channels to interface with memory system 330. In addition to normal DDRx memory channels, APU 310 supports NVDIMM-P 338 on a heterogenous memory channel 332 having both normal registered DIMMs or RDIMMs 334 and 336 and NVDIMM-P 338, in addition to a homogeneous memory channel 340 having only RDIMMs 344, 346, and 348 connected over bus 342. While in this embodiment heterogenous memory channel 332 connects to both NVDIMM-Ps and RDIMMs, the heterogenous memory channel has the ability to interface with all NVDIMM-P type DIMMs in some embodiments. Transactions between the memory controller on APU 310 and NVDIMM-P 338 are protected by link ECC. Link ECC ensures data integrity for the data transfer between the memory controller and the NVDIMM over memory channel 332.

While NVDIMM-P type DIMMs are described in this embodiment, other embodiments employ the techniques herein to interface with other types of storage class memory (SCM) modules over a heterogeneous memory channel. As used herein, SCM indicates a memory module with non-volatile memory that is addressable in the system memory space. The non-volatile memory in an SCM module can be buffered with RAM and/or paired with RAM on board the SCM module. The SCM memory address map appears alongside conventional DRAM population from the operating system (OS) perspective. The OS is typically aware that the SCM defined address range is a "different" type of memory than conventional memory. This distinction is to inform the OS that this memory may be more latent and has a persistent quality. The OS can map the SCM memory as Direct Access memory or Filesystem Access memory. Direct Access implies the OS accessing the SCM address range as physical addressable memory. File system access implies the OS manages the persistent memory as part of the file system and manages access to the SCM via file-based API. Ultimately the request comes to the memory controller within the SCM address range independent of how the OS at a higher level manages the access.

Figure 4:
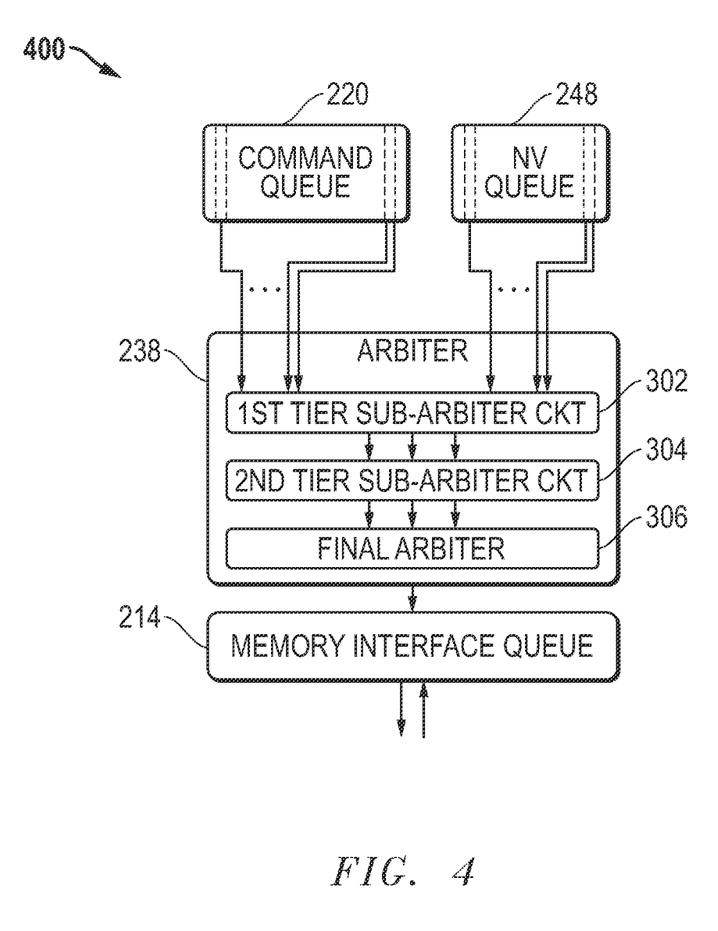
FIG. 4 illustrates in block diagram form a portion of a memory controller suitable for use in the memory controller of FIG. 2 according to some embodiments.

FIG. 4 illustrates in block diagram form a portion 400 of a memory controller that is suitable for use in memory controller 200 of FIG. 2 according to some embodiments. The depicted portion 400 includes command queue 220, NV queue 248, arbiter 238, and memory interface queue 214. As described above, command queue 220 receives memory access requests for a memory channel, and includes a number of entries for holding a predetermined number of memory access requests, for example 64 requests.

Arbiter 238 is provided for selecting memory requests from command queue 220 and NV queue 248 for dispatch to a corresponding one of persistent memory such as NVDIMM 338 and a DRAM memory such as RDIMMs 334 and 336 connected to a memory channel such as heterogeneous memory channel 332 (FIG. 3). Arbiter 238 includes a first-tier sub-arbiter circuit 302, second-tier sub-arbiter circuit 304, and final arbiter 306.

First-tier sub-arbiter circuit 302 is connected to command queue 220 and NV queue 248 and includes comparison logic for selecting candidate commands from among DRAM commands and persistent memory commands. Multiple candidate commands are presented at the outputs of first-tier sub-arbiter circuit 302 which are connected to respective inputs of second-tier sub-arbiter circuit 304. In some embodiments, first-tier sub-arbiter circuit 302 includes at least two first-tier sub-arbiters each selecting from among candidate DRAM commands and persistent memory commands and each having an output indicating a selected candidate command. In this embodiment, command queue 220 holds both DRAM commands and persistent memory commands originally received at the memory controller. Persistent memory commands held in command queue 220 include buffered persistent memory commands such as XREAD and WRITE, persistent memory write commands such as PWRITE, and speculative read commands such as SREAD, which will return read results from the non-volatile memory immediately if the desired data is buffered, but will enter a non-volatile read cycle and return results when they are available if the desired data is not buffered and instead must be read from persistent memory. For certain non-volatile read commands transmitted over the memory channel, the non-volatile DIMM typically responds after a non-deterministic time period due to the unpredictable process of reading the requested data, which may be in non-volatile memory at the non-volatile DIMM, in DRAM at the non-volatile DIMM, or in a cache at the media controller. During the non-deterministic time period, other memory access commands are typically fulfilled and removed from the memory interface queue. When the media controller at the non-volatile DIMM completes the process of reading the requested data, it sends a ready response signal "RD_RDY" to the memory controller.

NV buffer 247 includes NV queue 248 and certain non-volatile dual inline memory module (NVDIMM) control circuits for performing control functions specific to NVDIMMs or other persistent memory modules. NV queue 248 holds XREAD commands that have been generated for XREAD commands by a NVDIMM control circuit in NV buffer 247. If other non-volatile read commands employ the RD_RDY/SEND process, they are also stored in NV queue 248 awaiting fulfillment. The commands are held awaiting a RD_RDY signal from the non-volatile memory indicating the data is ready to be transmitted back to the memory controller. When responsive data is received, the associated pending non-volatile read command is removed from NV queue 248. In this embodiment, under the NVDIMM process, the individual SEND commands are not associated with a specific pending non-volatile read command until the data is sent, and so NV queue 248 is only required to track the number of pending SEND commands and present a single SEND command to first-tier sub-arbiter circuit 302.

In some embodiments, one or more separate command queues may be used for non-volatile memory commands such as XREAD and WRITE commands. In such embodiments, the separate command queue(s) also have entries connected to the inputs of first-tier sub arbiter circuit 302, in parallel to the depicted connections to command queue 220 and NV queue 248. In this embodiment first-tier sub-arbiter circuit 302 has a single input from NV queue 248 receiving a pending SEND command for consideration as a candidate.

Second-tier sub-arbiter circuit 304 is connected to first-tier sub-arbiter circuit 302 for receiving the candidate commands selected by first-tier sub-arbiter circuit 302. Second-tier sub-arbiter circuit 304 generally includes comparison logic to implement a set of ordering rules and to select at least one command from among the candidate commands. In this embodiment, second-tier sub-arbiter circuit 304 selects multiple second-tier candidate commands which are presented to final arbiter 306 at respective outputs of second-tier sub-arbiter circuit 304. In other embodiments, a final arbiter is not used and instead second-tier sub-arbiter circuit 304 makes a final command selection.

Final arbiter 306 has multiple inputs connected to second-tier sub-arbiter circuit 304 and at least one output connected to memory interface queue 214. Final arbiter 306 includes comparison logic for selecting at least one command as the final arbitration winner for dispatch to memory interface queue 214. Final arbiter 306 also includes logic for performing such functions as inserting refresh commands for the DRAM memory. Various other control circuits may be included to provide inputs to the sub-arbiters of arbiter 238, such as timing block 234, page table 236, and refresh logic 232 (FIG. 2).

Figure 5:
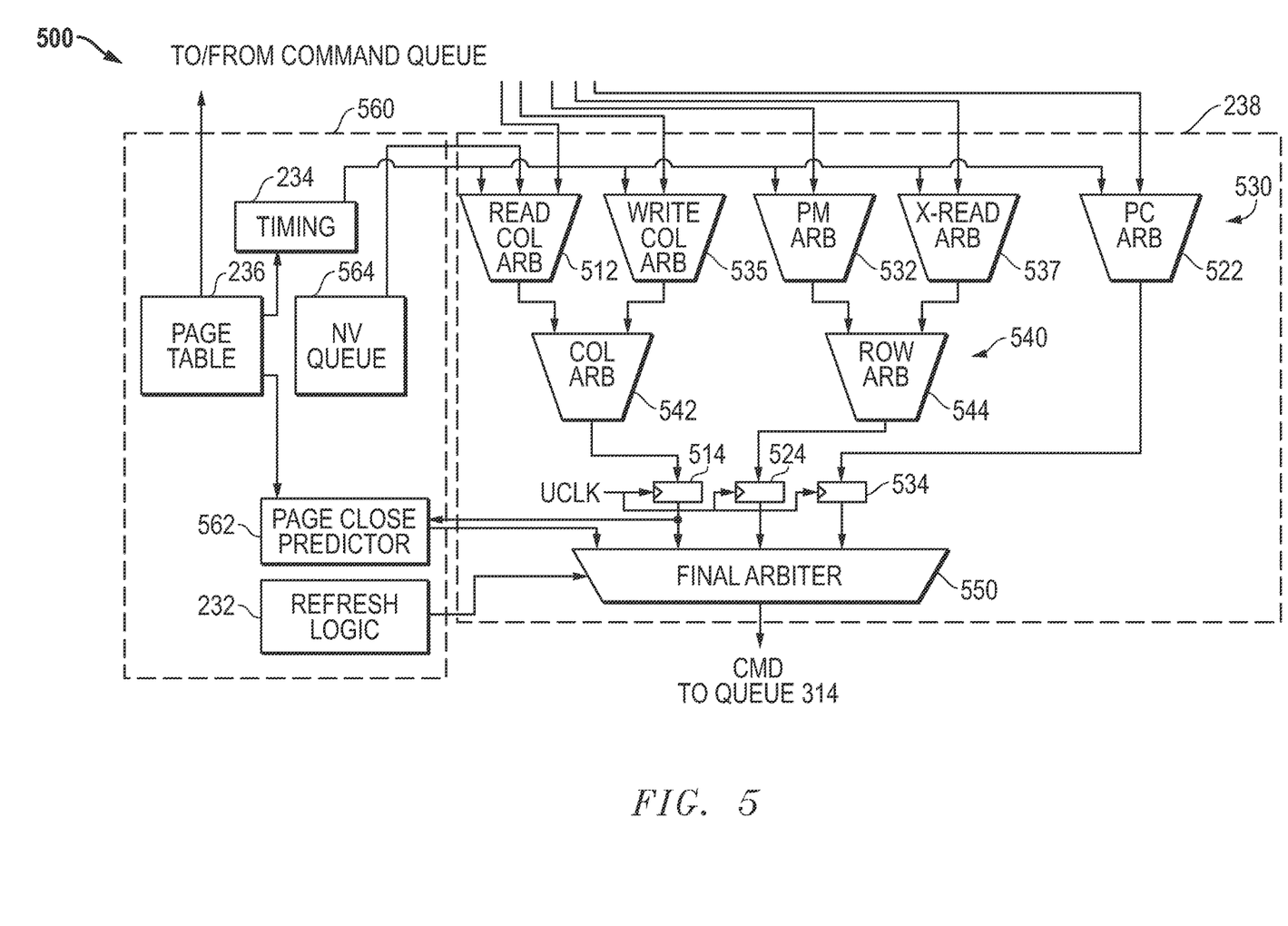
FIG. 5 illustrates in block diagram form a portion of a memory controller suitable for use in memory controller 200 of FIG. 2 according additional embodiments.

FIG. 5 illustrates in block diagram form a portion 500 of a memory controller that is suitable for use in memory controller 200 of FIG. 2 according additional embodiments. Portion 500 includes arbiter 238 and a set of control circuits 560 associated with the operation of arbiter 238. In this embodiment, arbiter 238 is a three-tier arbiter includes a set of first-tier sub-arbiters 530, a set of second-tier sub-arbiters 540, and a final arbiter 550. In this embodiment, like the embodiment of FIG. 4, the command queue 220 holds both DRAM commands and persistent memory commands, while NV queue ("NVQ") 564 holds XREAD commands for persistent memory reads that are awaiting a signal from the persistent memory that the read results are ready.

First-tier sub-arbiters 530 read column sub-arbiter 512 ("READ COL ARB"), a write column sub-arbiter 535 ("WRITE COL ARB"), a page miss sub-arbiter 532 ("PM ARB"), a transaction read sub-arbiter 537 ("XREAD ARB"), and a page conflict sub-arbiter 522 ("PC ARB"). Second-tier sub-arbiters 540 include column sub-arbiter 542 ("COL ARB") and row sub-arbiter 544 ("ROW ARB").

READ COL ARB 512 includes an input connected to command queue 220, an input connected to NV queue 564, an input connected to timing block 234, and an output connected to COL ARB 542. READ COL ARB 512 selects from among certain available DRAM commands and persistent memory commands, which include read CAS commands, SREAD commands, and a SEND commands for a pending XREAD command. In this embodiment READ COL ARB 512 has a single input from NV queue 564 receiving a SEND command for consideration as a candidate. The XREAD commands are held in NV queue 564 awaiting fulfillment, while the read CAS commands and SREAD commands are held in command queue 220. Typically SEND commands are not associated with individual XREAD commands until responsive data is received, so NV queue 564 is only required to track the number of SEND commands pending based on unfulfilled RD_RDY responses. The input width of READ COL ARB 512 in this embodiment is therefore the number of entries in command queue 220 plus an input from NV queue 564. READ COL ARB 512 includes digital logic to compare various timing and priority characteristics for each command, including whether the commands are page hits, in selecting a candidate command to present at the output as a sub-arbitration winner.

WRITE COL ARB 535 includes an input connected to command queue 220, an input connected to timing block 234, and an output connected to COL ARB 542. WRITE COL ARB 535 also selects from among DRAM commands and persistent memory commands, including write CAS commands and transaction write commands (XWRITE). The input width of WRITE COL ARB 535 in this embodiment is the number of entries in command queue 220, because both write commands and XWRITE commands are held in command queue 220. WRITE COL ARB 535 includes digital logic to compare various timing and priority characteristics for each command in selecting a candidate command to present as a winner at the output connected to COL ARB 542. READ COL ARB 512 and WRITE COL ARB together function as a page hit sub-arbiter in selecting candidate commands that are page hits, while also arbitrating SREAD, SEND, and XWRITE commands.

PM ARB 532 includes an input connected to command queue 220, an input connected to timing block 234, and an output connected to ROW ARB 544. The input width of PM ARB 532 is the number of entries in command queue 220. PM ARB 532 contains digital logic for comparing various characteristics of page miss commands and selecting a candidate command to present as an arbitration winner at the output.

XREAD ARB 537 includes an input connected to command queue 220, an input connected to timing block 234, and an output connected to ROW ARB 544, and has a similar width to PM ARB 532. XREAD ARB selects a candidate from among XREAD commands held in command queue 220, and presents the candidate as an arbitration winner at the output connected to ROW ARB 544.

PC ARB 522 includes an input connected to command queue 220, an input connected to timing block 234, and an output connected to a register 534. PC ARB 522 also has an input width of the size of command queue 220. PC ARB 522 includes digital logic for selecting a page conflict commands as a sub-arbitration winner based on the command characteristics, typically the priority and/or age. In this embodiment, PC ARB 522 does not present the winning candidate to a second-tier sub-arbiter, and instead feeds it directly to register 534 for input into final arbiter 550.

The second tier of sub-arbiters includes COL ARB 542 and ROW ARB 544. Each of these sub-arbiters may include registers at their inputs for receiving the candidate commands at each clock cycle, similar to registers 514, 524, and 534. COL ARB 542 receives the candidate command from READ COL ARB 512 and the candidate command from WRITE COL ARB 535 at its two inputs, and selects a sub-arbitration winner based on the command characteristics. The winning candidate is fed to register 514 for input to final arbiter 550. Similarly, ROW ARB 544 receives the candidate commands from PM ARB 532 and XREAD ARB 537 at its inputs, and selects a sub-arbitration winner based on the command characteristics. The winning candidate is fed to register 524 for input to final arbiter 550.

Register 514 has a data input connected to the output of COL ARB 542, a clock input for receiving the UCLK signal, and an output. Register 524 has a data input connected to the output of ROW ARB 544, a clock input for receiving the UCLK signal, and an output. Register 534 has a data input connected to the output of PC ARB 522, a clock input for receiving the UCLK signal, and an output.

Final arbiter 550 has a first input connected to the output of refresh control logic 232, a second input from a page close predictor 562, a third input connected to the output of output register 514, a fourth input connected to the output of output register 524, a fifth input connected to the output of output register 534, a first output for providing a first arbitration winner to queue 214 labelled "CMD".

Control circuits 560 include timing block 234 and page table 236 as previously described with respect to FIG. 2, a page close predictor 562. Timing block 234 has an input connected to page table 236, and an input and an output connected to READ COL ARB 512, WRITE COL ARB 535, page miss arbiter 532, XREAD ARB 537, and PC ARB 522. Page table 236, an output connected to the input of command queue 220, an output connected to the input of timing block 234, and an output connected to the input of page close predictor 562. Page close predictor 562 has an input connected to one output of page table 236, an input connected to the output of output register 514, and an output connected to the second input of final arbiter 550.

Each of READ COL ARB 512, WRITE COL ARB 535, page miss arbiter 532, XREAD ARB 537, and PC ARB 522 has an input connected to the output of timing block 234 to determine timing eligibility of commands in command queue 220 that fall into these respective categories. Timing block 234 includes an array of binary counters that count durations related to the particular operations for each bank in each rank. The number of timers needed to determine the status depends on the timing parameter, the number of banks for the given memory type, and the number of ranks supported by the system on a given memory channel. The number of timing parameters that are implemented in turn depends on the type of memory implemented in the system. For example, DDR5 and GDDR5 memories require more timers to comply with more timing parameters than other DDRx memory types. By including an array of generic timers implemented as binary counters, timing block 234 can be scaled and reused for different memory types.

In operation, arbiter 238 selects memory access commands from command queue 220 and refresh control logic 232 by taking into account the page status of each entry, the priority of each memory access request, and the dependencies between requests. The priority is related to the quality of service or QoS of requests received from the AXI4 bus and stored in command queue 220, but can be altered based on the type of memory access and the dynamic operation of arbiter 238. Final arbiter 550 selects between these three sub-arbitration winners as well as a refresh operation from refresh control logic 232, and may further modify a read or write command into a read or write with auto-precharge command as determined by page close predictor 562.

READ COL ARB 512 and WRITE COL ARB 535 arbitrate between page hits, that is, read or write cycles to an open page, as well as SEND command, SREAD commands, and WRITE commands. The timing eligibility parameters tracked by timers in timing block 234 and checked by READ COL ARB 512 include, for example, row address strobe (RAS) to column address strobe (CAS) delay time ($t_{RCD}$) and CAS to CAS latency ($t_{CCD}$). For example, $t_{RCD}$ specifies the minimum amount of time that must elapse before a read access to a page after it has been opened in a RAS cycle. COL ARB 542 selects a sub-arbitration winner based on the assigned priority of the accesses. In one embodiment, the priority is a 4-bit, one-hot value that therefore indicates a priority among four values, however it should be apparent that this four-level priority scheme is just one example. Read CAS, SREAD, and SEND commands are selected by READ COL ARB 512 at appropriate times to keep the data bus active. Because these DRAM and persistent memory reads both occupy the data bus when fulfilled, it is advantageous to arbitrate them together at READ COL ARB 512 to both reduce the complexity (and therefore the size) of the comparison logic in READ COL ARB 512, and to reduce the number of inputs to final arbiter 550.

A page conflict is an access to one row in a bank when another row in the bank is currently activated. PC ARB 522 arbitrates between accesses in command queue 220 to pages that conflict with the page that is currently open in the corresponding bank and rank. PC ARB 522 selects a sub-arbitration winner that causes the issuance of a precharge command. The timing eligibility parameters tracked by timers in timing block 234 and checked by PC ARB 522 include, for example, active to precharge command period ($t_{RAS}$). Page conflict sub-arbitration for write commands also considers the bank group number for candidate write commands. PC ARB 522 selects a sub-arbitration winner based on the assigned priority of the access. If PC ARB 522 detects two or more requests at the same priority level, then the oldest entry wins.

A page miss is an access to a bank that is in the precharged state. Page miss arbiter 532 arbitrates between accesses in command queue 220 to precharged memory banks. The timing eligibility parameters tracked by timers in timing block 234 and checked by page miss arbiter 532 include, for example, precharge command period ($t_{RP}$). If there are two or more requests that are page misses at the same priority level, then the oldest entry wins.

Each sub-arbiter outputs a priority value for their respective sub-arbitration winner. Final arbiter 550 compares the priority values of the sub-arbitration winners from each of COL ARB 542, ROW ARB 544, and PC ARB 522. Final arbiter 550 determines the relative priority among the sub-arbitration winners by performing a set of relative priority comparisons. Final arbiter 550 also determines whether the sub-arbitration winners conflict (i.e. whether they are directed to the same DRAM bank and rank). When there are no such conflicts, then final arbiter 550 selects the command with the highest priorities. When there are conflicts, then final arbiter 550 complies with the following rules. When the priority value of the sub-arbitration winner COL ARB 542 is higher than that of PC ARB 522, and they are both to the same bank and rank, then final arbiter 550 selects the access indicated by COL ARB 542. When the priority value of the sub-arbitration winner of PC ARB 522 is higher than that of COL ARB 542, and they are both to the same bank and rank, final arbiter 550 selects the winner based on several additional factors. In some cases, page close predictor 562 causes the page to close at the end of the access indicated by COL ARB 542 by setting the auto precharge attribute.

If an SREAD is picked by READ COL ARB 512, it is treated like a SEND command, and data bus slots are reserved for receiving the read data for the SREAD command in the event that SREAD hits the persistent memory cache (such as an NVDIMM cache). If the SREAD is found to be a miss, the persistent memory module does not send data, causing an unoccupied slot in the data bus slots reservations. In that case, when the response of the SREAD arrives at the memory controller, controller will generate a SEND command for the SREAD. Within READ COL ARB 512, the priority is initially set by the request priority from the memory accessing agent, but the priority is adjusted dynamically based on the type of accesses (read or write) and the sequence of accesses. In general, COL ARB 542 assigns a higher implicit priority to reads, but implements a priority elevation mechanism to ensure that writes make progress toward completion.

Whenever COL ARB 542 selects a read or write command, page close predictor 562 determines whether to send the command with the auto-precharge (AP) attribute or not. During a read or write cycle, the auto-precharge attribute is set with a predefined address bit and the auto-precharge attribute causes the DDR device to close the page after the read or write cycle is complete, which avoids the need for the memory controller to later send a separate precharge command for that bank. Page close predictor 562 takes into account other requests already present in command queue 220 that access the same bank as the selected command. If page close predictor 562 converts a memory access into an AP command, the next access to that page will be a page miss.

In other embodiments, arbiter 238 could include a different number of tiers, and a different number of sub-arbiters. For example, some embodiments include two tiers: a first-tier sub-arbiter circuit coupled to the command queue for selecting candidate commands from among DRAM commands and persistent memory commands, and a second-tier sub-arbiter circuit coupled to the first-tier sub-arbiter circuit for receiving the candidate commands and selecting at a final arbitration winner from among the candidate commands. One such embodiment is constructed using the depicted sub-arbiters 512, 535, 532, 537, and 522 in the first tier, with the sub-arbitration winners from the first tier fed directly to a final arbiter, which performs the described functionality of COL ARB 542, ROW ARB 544, and final arbiter 550 in a single comparison step. In yet other embodiments, READ COL ARB and WRITE COL ARB are consolidated since candidate read commands and write commands are not arbitrated at the same time and their arbitration shares similar logic. In such embodiments, the same arbitration logic can be used in a read burst mode and a write burst mode. In write arbitration mode, NV queue 564 inputs are masked out.

Figure 6:
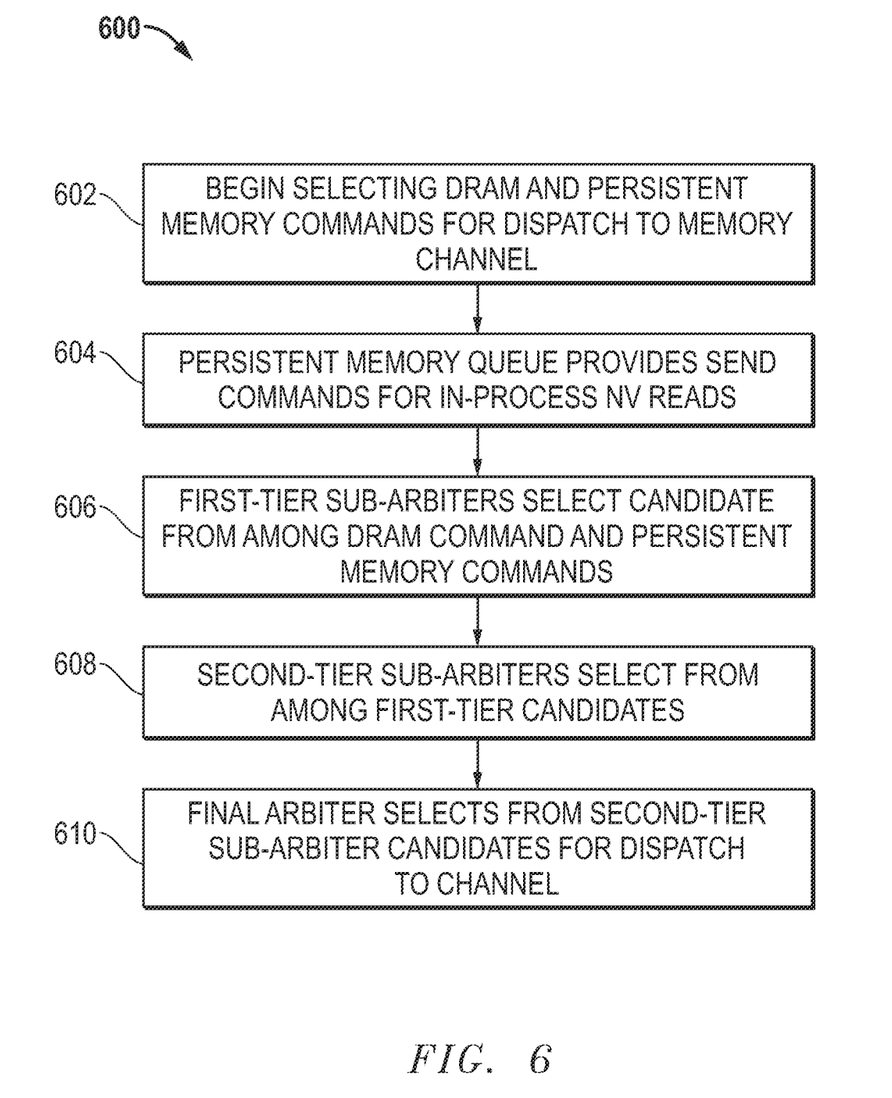
FIG. 6 illustrates in diagram form a process of handling memory access commands according to some embodiments.

FIG. 6 is a flow diagram 600 of process for handling memory access commands according to some embodiments. The depicted process is suitable for implementation with an arbiter such as those depicted in FIG. 3 and FIG. 4, or other memory controller arrangements. The process begins by selecting DRAM and persistent memory access commands for dispatch to a memory channel at block 602. Generally, the commands are received at a memory controller and placed in a command queue to await dispatch to a DRAM memory and a persistent memory. In some embodiments, both DRAM and persistent memory commands (except for SEND commands) are present in a single command queue, such as command queue 220 (FIG. 2). As shown at block 604, commands for in process persistent or nonvolatile memory reads ("NV reads") are provided at a persistent memory queue such as NV queue 248 (FIG. 4). As discussed above, in some embodiments, NV queue 248 is only required to track the number of pending SEND commands for XREAD or other persistent memory read commands held in NV queue 248 awaiting fulfillment.

At block 606, one or more first-tier sub-arbiters select candidate commands from among DRAM commands and persistent memory commands. Generally the DRAM commands include READ and WRITE commands, along with variants of such commands, which may be decoded to a form such as READ CAS for use with the DRAM technology employed. The persistent memory commands include persistent memory module commands such as XREAD (sometimes referred to as "X-READ"), WRITE (sometimes referred to as "X-WRITE"), SREAD, and other non-volatile memory commands which may be specific to the particular persistent memory employed. Some persistent memory commands have required a commitment to non-volatile storage in a persistent memory module, while others may be fulfilled from a DRAM buffer associated with the persistent memory module, such as an NVDIMM-P. Both such variants are referred to as persistent memory commands herein.

The selection of candidates from among both DRAM and persistent memory commands at block 606 provides several advantages as compared to using separate sub-arbiters for DRAM and persistent memory. When DRAM and persistent memory are both present on a memory channel, the ultimate command selection requires complex comparisons which need to distribute to different arbiters, so no arbiter is the timing bottleneck. There is a tradeoff between including more sub-arbiter inputs with simpler comparison logic or fewer sub-arbiters inputs with more complex comparison logic. The process described herein, for example implemented as shown in FIG. 3 or FIG. 4, avoids both high numbers of inputs and at the same time reduces complexity of the comparison logic by distributing it effectively among the sub-arbiters. Such distribution results in efficient logic with less redundancy, allowing the arbiter to meet the speed demands of the memory bus without excessively large comparison logic. Also, the techniques herein adopt a resource centric arbitration organization (cross-DIMM type based) rather than functional organization (i.e. isolated DIMM type based). Such an approach merges different data commands (such as CAS, SREAD, SEND, WRITE) to avoid data bus contention, and merges one data command, one row command, and one precharge command to avoid command bus contention.

At block 608, one or more second-tier sub-arbiters select from among the candidates provided by the first-tier sub-arbiters. For example, in the implementation of FIG. 5, COL ARB 542 selects from among candidate commands which may be DRAM commands (typically page hits) or persistent memory commands, while ROW ARB 544 also selects from among candidate commands which may be DRAM row open commands (page misses) or persistent memory commands. In some embodiments, as discussed above, the second-tier sub-arbiter also functions as the final sub-arbiter. In such embodiments the comparison logic of the second-tier sub arbiter has a higher complexity as discussed above.

At block 610, the final arbiter selects at least one command from among the second-tier sub-arbiter for dispatch to the memory channel. As can be understood, in any particular command dispatch cycle, a DRAM command or a persistent memory command may be selected by the final arbiter. The distribution of selection logic among multiple tiers of an arbiter according to this process allows an efficient process of merging the selection of DRAM commands and persistent memory commands, while allowing an arbiter design to meet the speed demands of a DRAM arbitration process while handling the added complexity associated with handling persistent memory commands on the same channel. Thus, a memory controller and data processing system as described herein improves the ability of the memory controller to interface with non-volatile memory modules.

Memory controller 200 of FIG. 2 or any portions thereof, such as arbiter 238, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the internal architecture of memory channel controller 210 and/or power engine 250 may vary in different embodiments. Memory controller 200 may interface to other types of memory besides NVDIMM-P and DDRx, such as high bandwidth memory (HBM), RAMbus DRAM (RDRAM), and the like. While the illustrated embodiment showed each rank of memory corresponding to separate DIMMs, in other embodiments each DIMM can support multiple ranks. Further, while a heterogenous memory channel is generally supported, the heterogenous channel may be filled entirely with non-volatile DIMMs. Furthermore, while the example type of non-volatile read commands discussed herein is XREAD commands, other types of non-volatile read commands are supported. For example, the NVDIMM-P specification provides a speculative read (SREAD) command that has a deterministic response time if the requested memory is found in DRAM on the non-volatile DIMM, but is interpreted as a non-volatile read with a non-deterministic response time if the non-volatile DIMM determines the requested data is not available in DRAM and it instead has to read from the non-volatile memory medium. In some embodiments, if such a "miss" occurs SREAD commands are also be added to the NV queue and then treated similar to XREADs.

Accordingly, it is intended by the appended claims to cover all modifications of the disclosed embodiments that fall within the scope of the disclosed embodiments.

What is claimed is:

1. A memory controller, comprising:
    a command queue including an input for receiving memory access commands for a memory channel, and a number of entries for holding a predetermined number of memory access commands; and
    an arbiter for selecting memory access commands from the command queue for dispatch to one of a persistent memory and a DRAM memory, both coupled to the memory channel, the arbiter comprising:
        a first-tier sub-arbiter circuit coupled to the command queue and including at least a first first-tier sub-arbiter that selects candidate commands from both at least one DRAM command and at least one persistent memory command and a second first-tier sub-arbiter that selects candidate commands from both at least one DRAM command and at least one persistent memory command; and
        a second-tier sub-arbiter circuit coupled to the first-tier sub-arbiter circuit for receiving the respective candidate commands and selecting at least one command from among the respective candidate commands.

2. The memory controller of claim 1, wherein the first first-tier sub-arbiter is a read column sub-arbiter selecting from among read column-address strobe (CAS) and SREAD commands, and the second first-tier sub-arbiter is a write column sub-arbiter selecting from write CAS and X-WRITE commands.

3. The memory controller of claim 2, wherein:
    the first-tier sub-arbiters further include a page miss sub-arbiter, and an X-READ sub-arbiter each selecting respective candidate commands; and
    the second-tier sub-arbiter circuit includes a first sub-arbiter selecting a candidate command from the read column sub-arbiter and the write column sub-arbiter, and a second sub-arbiter selecting a candidate command from the page miss sub-arbiter and the X-read sub-arbiter;
    wherein the arbiter further comprises a final arbiter which selects from the candidate commands of the first sub-arbiter and the second sub-arbiter.

4. The memory controller of claim 3, further comprising a page conflict sub-arbiter coupled to the command queue for selecting a page-conflict candidate command, and wherein the final arbiter also selects from the page-conflict candidate command.

5. The memory controller of claim 3, wherein the read column sub-arbiter also selects from a SEND command for the persistent memory.

6. The memory controller of claim 5, further comprising a persistent memory command queue from which the read column sub-arbiter selects a SEND command.

7. The memory controller of claim 6, wherein the persistent memory command queue is provided SEND commands by the memory controller based on read ready responses sent from a non-volatile dual inline memory module (NVDIMM) control circuit.

8. A method, comprising:
    receiving a plurality of memory access commands at a memory controller including DRAM commands and persistent memory commands;
    placing the memory access commands in a command queue to await dispatch to a DRAM memory and a persistent memory;
    selecting multiple candidate commands from the command queue, at least two of the candidate commands each selected by considering both at least one of the DRAM commands and at least one of the persistent memory commands; and
    selecting at least one command from among the candidate commands for sending on a memory channel.

9. The method of claim 8, wherein selecting the multiple candidate commands is performed with at least two first-tier sub-arbiters each selecting from at least one of the DRAM commands and at least one of the persistent memory commands and each having an output indicating a selected candidate command.

10. The method of claim 8, wherein selecting multiple candidate commands comprises selecting a first candidate from among read column-address strobe (CAS) and SREAD commands, selecting a second candidate from among write CAS and X-WRITE commands, selecting a third candidate from among page-miss commands, and selecting a fourth candidate from among X-READ commands.

11. The method of claim 10, further comprising selecting a second-tier candidate command from among the first candidate and the second candidate, and selecting another second-tier candidate from among the third candidate and the fourth candidate.

12. The method of claim 11, wherein selecting at least one command from among the candidate commands for sending on a memory channel comprises selecting a final candidate from among the second-tier candidate commands.

13. The method of claim 12, wherein selecting multiple candidate commands further comprises selecting from an available SEND command from a persistent memory queue.

14. A data processing system, comprising:
   a memory channel coupled to a DRAM memory and a persistent memory;
   a memory controller coupled to the memory channel, comprising:
   a command queue including an input for receiving memory access commands for the memory channel, and a number of entries for holding a predetermined number of memory access commands; and
   an arbiter for selecting memory access commands from the command queue for transmission to one of the persistent memory and the DRAM memory, the arbiter comprising:
      a first-tier sub-arbiter circuit coupled to the command queue and including at least a first first-tier sub-arbiter that selects candidate commands from both at least one DRAM command and at least one persistent memory command and a second first-tier sub-arbiter that selects candidate commands from both at least one DRAM command and at least one persistent memory command; and
      a second-tier sub-arbiter circuit coupled to the first-tier sub-arbiter circuit for receiving the candidate commands and selecting at least one command from among the candidate commands.

15. The data processing system of claim 14, wherein the first first-tier sub-arbiter is a read column sub-arbiter selecting from among read column-address strobe (CAS) and SREAD commands, and the second first-tier sub-arbiter is a write column sub-arbiter selecting from write CAS and X-WRITE commands.

16. The data processing system of claim 15, wherein:
   the first-tier sub-arbiters further include a page miss sub-arbiter, and an X-READ sub-arbiter each selecting respective candidate commands; and
   the second-tier sub-arbiter circuit includes a first sub-arbiter selecting a candidate command from the read column sub-arbiter and the write column sub-arbiter, and a second sub-arbiter selecting a candidate command from the page miss sub-arbiter and the X-read sub-arbiter,
   wherein the arbiter further comprises a final arbiter which selects from the candidate commands of the first sub-arbiter and the second sub-arbiter.

17. The data processing system of claim 16, further comprising a page conflict sub-arbiter coupled to the command queue for selecting a page-conflict candidate command, and wherein the final arbiter also selects from the page-conflict candidate command.

18. The data processing system of claim 16, wherein the read column sub-arbiter also selects from SEND commands for the persistent memory.

19. The data processing system of claim 18, further comprising a persistent memory command queue from which the read column sub-arbiter is provided a SEND command.

20. The data processing system of claim 19, wherein the persistent memory command queue is provided SEND commands by the memory controller based on read ready responses sent from a non-volatile dual inline memory module (NVDIMM) control circuit.

* * * * *